United States Patent
Huang et al.

(10) Patent No.: US 9,601,324 B2
(45) Date of Patent: Mar. 21, 2017

(54) METHOD OF MAKING WAFER ASSEMBLY

(71) Applicant: TAIWAN SEMICONDUCTOR MANUFACTURING COMPANY, LTD., Hsinchu (TW)

(72) Inventors: I-Hsiung Huang, Hsinchu County (TW); Heng-Hsin Liu, New Taipei (TW); Heng-Jen Lee, Baoshan Township (TW); Chin-Hsiang Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/798,799

(22) Filed: Jul. 14, 2015

(65) Prior Publication Data

US 2015/0318165 A1 Nov. 5, 2015

Related U.S. Application Data

(62) Division of application No. 13/539,243, filed on Jun. 29, 2012, now Pat. No. 9,111,982.

(60) Provisional application No. 61/638,209, filed on Apr. 25, 2012.

(51) Int. Cl.
*H01L 21/02* (2006.01)
*H01L 21/683* (2006.01)

(52) U.S. Cl.
CPC ...... *H01L 21/0201* (2013.01); *H01L 21/6835* (2013.01); *H01L 2221/6834* (2013.01); *H01L 2221/68381* (2013.01)

(58) Field of Classification Search
CPC ..... H01L 2221/68368; H01L 21/76251; H01L 23/544
USPC .................. 257/797; 438/401, 464, 406, 459
See application file for complete search history.

(56) References Cited

U.S. PATENT DOCUMENTS

| | | | |
|---|---|---|---|
| 5,236,118 A | 8/1993 | Bower et al. | |
| 6,441,504 B1* | 8/2002 | Glenn | B23D 59/001 257/730 |
| 8,324,006 B1* | 12/2012 | Adler | B06B 1/0292 257/416 |
| 2002/0094663 A1 | 7/2002 | Kwon et al. | |
| 2004/0096755 A1* | 5/2004 | Koike | G03F 1/20 430/5 |
| 2004/0157408 A1 | 8/2004 | Best et al. | |

(Continued)

FOREIGN PATENT DOCUMENTS

| | | |
|---|---|---|
| DE | 10029035 | 2/2002 |
| EP | 1278245 | 1/2003 |

(Continued)

OTHER PUBLICATIONS

Office Action dated Dec. 30, 2013 with English Translation from corresponding application No. KR10-2012-0127609.

(Continued)

*Primary Examiner* — Kyoung Lee
*Assistant Examiner* — Ratisha Mehta
(74) *Attorney, Agent, or Firm* — Slater Matsil, LLP

(57) ABSTRACT

A method including bonding a process wafer having integrated circuits and a carrier wafer having at least one alignment mark to form a wafer assembly. The method further includes aligning the wafer assembly using the at least one alignment mark of the carrier wafer.

21 Claims, 2 Drawing Sheets

(56) References Cited

U.S. PATENT DOCUMENTS

| | | | |
|---|---|---|---|
| 2008/0122041 A1 | 5/2008 | Kroener et al. | |
| 2009/0250823 A1 | 10/2009 | Racz et al. | |
| 2010/0078753 A1* | 4/2010 | Mehregany | G01F 1/6888 |
| | | | 257/467 |
| 2010/0210088 A1* | 8/2010 | Ishimaru | G03F 9/708 |
| | | | 438/401 |
| 2011/0042729 A1* | 2/2011 | Chen | H01L 21/31116 |
| | | | 257/288 |
| 2011/0297329 A1* | 12/2011 | Canale | H01L 21/67092 |
| | | | 156/756 |
| 2012/0223440 A1* | 9/2012 | Fujita | H01L 21/76898 |
| | | | 257/774 |
| 2012/0276689 A1* | 11/2012 | Canale | C03C 17/00 |
| | | | 438/106 |

FOREIGN PATENT DOCUMENTS

| | | |
|---|---|---|
| KR | 10-0401655 | 10/2003 |
| KR | 10-2004-0055696 | 6/2004 |
| KR | 10-2012-0027237 | 3/2012 |
| TW | 477465 | 2/2002 |
| TW | 200605258 | 2/2006 |
| WO | 2011130586 | 10/2011 |

OTHER PUBLICATIONS

Office Action dated Sep. 19, 2014 from corresponding No. TW 102110602.
Office Action dated Nov. 28, 2012 from corresponding application No. DE 10 2012 107 899.8.

* cited by examiner

METHOD OF MAKING WAFER ASSEMBLY

PRIORITY CLAIM

The present application is a divisional of U.S. application Ser. No. 13/539,243, filed Jun. 29, 2012, which claims priority of U.S. Provisional Application No. 61/638,209, filed Apr. 25, 2012, which are incorporated herein by reference in their entireties.

TECHNICAL FIELD

The present disclosure relates generally to a semiconductor assembly and more particularly a method of making a wafer assembly.

BACKGROUND

As the size of a wafer increases, sagging caused by the weight of the wafer and wafer warpage from a film growth process are challenging issues. The wafer warpage occurs when growing various films on the surface of a wafer as part of the device fabrication process. In one example, a 450 mm wafer would need to have a thickness of 1,800 μm (1.8 mm) to maintain the same level of wafer sag as a 300 mm wafer with a thickness of 775 μm. In another example, a 450 mm wafer with a 100 nm nitride film grown or deposited thereon may need to have a thickness of at least 1,180 μm to confine the wafer warpage to a level roughly the same as that of a 300 mm wafer with a thickness of 775 μm.

BRIEF DESCRIPTION OF THE DRAWINGS

Reference is now made to the following descriptions taken in conjunction with the accompanying drawings, in which.

DETAILED DESCRIPTION

Figure 1:
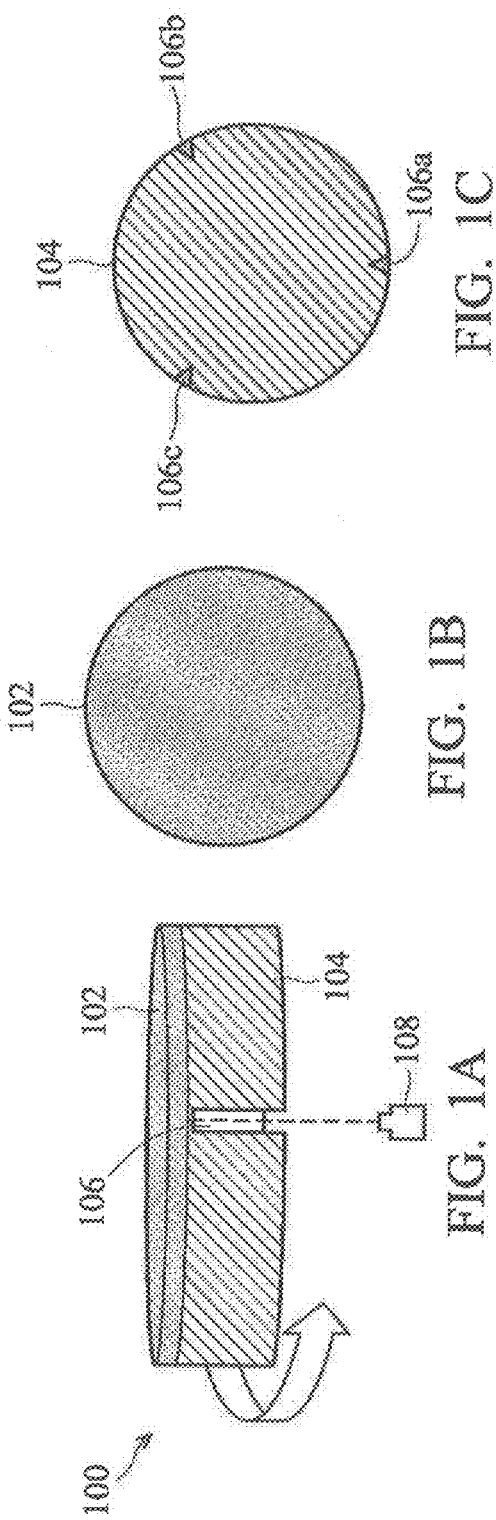
FIG. 1A is a schematic diagram of an exemplary wafer assembly with a carrier wafer according to some embodiments.
FIG. 1B is a top view of a process wafer of the wafer assembly in FIG. 1A according to some embodiments.
FIG. 1C is a top view of a carrier wafer of the wafer assembly in FIG. 1A according to some embodiments.
FIG. 1D is a top view of a carrier wafer of the wafer assembly in FIG. 1A according to some embodiments.
FIG. 1E is a schematic diagram of an exemplary wafer assembly with a carrier wafer according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic diagram of an exemplary wafer assembly 100 with a process wafer 102 and a carrier wafer 104 according to some embodiments. The wafer assembly 100 includes the process wafer 102 and the carrier wafer 104 bonded together. A bonding layer 103 (e.g., a bonding adhesive layer or an epitaxial layer) bonds the process wafer 102 and the carrier wafer 104 in some embodiments. The carrier wafer 104 has at least one alignment mark 106 so that an alignment mark detector 108 (which is not part of the wafer assembly 100) can detect the alignment mark 106 for wafer alignment. The process wafer 102 and the carrier wafer 104 can comprise any suitable material, e.g., silicon.

The thickness of the process wafer 102 is less than 925 μm for a 450 mm wafer in some embodiments. The thickness of the carrier wafer 104 is greater than 2000 μm for a 450 mm wafer in some embodiments. The greater thickness of the carrier wafer 104 compared to that of the process wafer 102 can reduce sagging and warpage of the wafer assembly 100 resulting from bigger wafer size and/or a film deposition process.

The alignment mark 106 can be one or more notches formed on the carrier wafer 104 on a sidewall of the carrier wafer 104. In one example, three notches as alignment marks 106 are distributed at equal distance along the circumference of the carrier wafer 104 and the three notches have different sizes to distinguish each individual notch. With three notches as alignment marks 106 at equal distance, the wafer assembly 100 is rotated 120° to find at least one of the notches for alignment. In this example, the productivity is improved compared to a wafer assembly 100 having only one notch as alignment mark 106 that may need a 360° rotation for alignment. The alignment mark detector 108 includes a laser diode and a photo detector to locate the position of the alignment mark 106 in some embodiments.

FIG. 1B is a top view of the process wafer 102 of the wafer assembly in FIG. 1A according to some embodiments. The process wafer 102 has a thickness less than 925 μm in some embodiments. With the process wafer 102 having thinner thickness (as thin as about 100 μm in some examples), the wafer cost can be reduced. Also, there is no need for alignment mark 106 on the process wafer 102 for the wafer assembly 100 because the carrier wafer 104 has the alignment mark 106. With no alignment mark 106 formed on the process wafer 102, the die yield of the process wafer 104 can be improved by utilizing all available surface of the process wafer 104 without reserving any area for alignment mark 106.

FIG. 1C is a top view of the carrier wafer 104 of the wafer assembly in FIG. 1A according to some embodiments. The thickness of the carrier wafer 104 is greater than 2000 μm for a 450 mm wafer in some embodiments. Three notches 106a, 106b, and 106c are formed as alignment marks 106, distributed at equal distance along the circumference of the carrier wafer 104. The three notches have different sizes to distinguish among themselves.

The carrier wafers 104 having multiple notches can enhance wafer alignment productivity. For example, with three notches 106a, 106b, and 106c as alignment mark 106 at equal distance, the wafer assembly 100 is rotated 120° to find at least one of the notches for alignment. In this example, the productivity is improved compared to a wafer assembly 100 having only one notch that may need a 360° rotation for alignment.

The notches 106a, 106b, and 106c can have different shapes (e.g., circular), have different numbers (e.g., four notches instead of three or less than three), and can include multiple notches at one position (e.g., one notch at 0°, two notches at 120°, three notches at 240°) in other embodiments. Also, different alignment marks 106 (e.g., dots or depressions on the side or the bottom of the carrier wafer 104) can be used instead of notches 106a, 106b, and 106c in other embodiments. In at least one embodiment, one or more of the notches 106a, 106b, and 106c or the alignment marks 106 are omitted.

In some embodiments, the carrier wafer 104 can be detached from the process wafer 102 in FIG. 1A and reused. The carrier wafer 104 detached from the process wafer 102 can be recycled after chemical mechanical planarization (CMP) polishing, for example.

Figure 2:
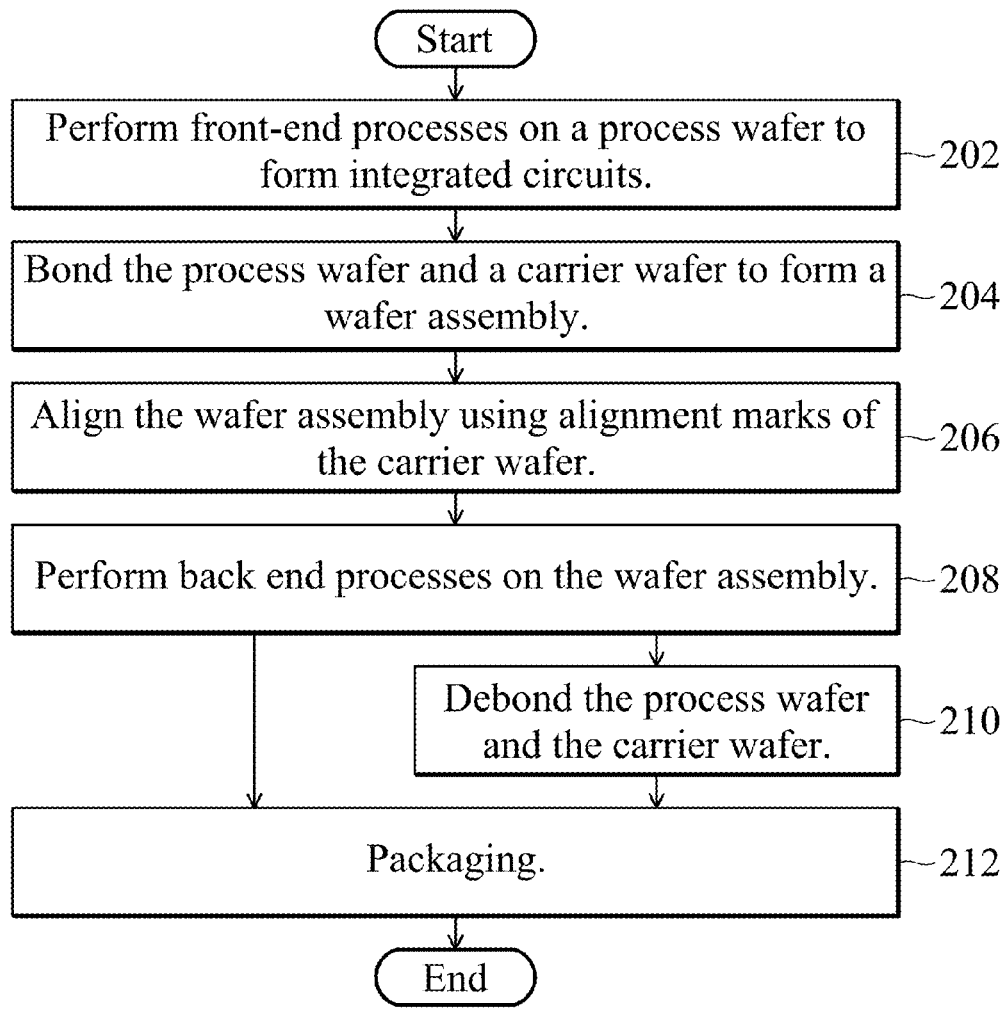
FIG. 2 is a flowchart of an exemplary method of fabricating integrated circuits using the exemplary wafer assembly in FIG. 1A according to some embodiments.

FIG. 2 is a flowchart of an exemplary method of fabricating integrated circuits using the exemplary wafer assembly 100 in FIG. 1A according to some embodiments. At step 202, front-end processes are performed on the process wafer 102 to form integrated circuits. The front-end processes can include forming shallow trench isolation (STI), forming wells, forming devices (e.g., transistors, capacitors, or resistors), forming interconnections, and/or any other suitable processes in some embodiments. The front-end processes can be performed by any suitable methods or processes known in the art.

At step 204, the process wafer 102 and the carrier wafer 104 are bonded to form the wafer assembly 100. In some embodiments, the process wafer 102 and the carrier wafer 104 are bonded together by using bonding materials in a bonding adhesive layer 103 between the process wafer 102 and the carrier wafer 104. The bonding materials can comprise any suitable materials known in the art. For example, commercially available WAFERBOND® HT-series temporary bonding materials designed to provide the necessary mechanical support during further processing (e.g., thinning, TSV process, etc.) at various temperatures.

In some other embodiments, the process wafer 102 and the carrier wafer 104 are bonded by growing an epitaxial layer 103 (e.g., Si epitaxy, or silicon epi layer) between the process wafer 102 and the carrier wafer 104 and annealing. For example, the silicon epi layer can be grown below the process wafer 102. The silicon epi layer is formed by performing a chemical vapor depositon (CVD) process for depositing thin films of single-crystal silicon in some embodiments. The wafer assembly 100 with the silicon epi layer 103 between the process wafer 102 and the carrier wafer 104 is then annealed at temperatures 300° C.-500° C. to bond the process wafer 102 and the carrier wafer 104 in some embodiments.

At step 206, the wafer assembly 100 is aligned using the alignment mark 106 (e.g., notches 106a, 106b, and 106c in FIG. 1C) on the carrier wafer 104. The alignment can be performed by using the alignment mark detector 108 that includes a laser diode and a photo detector to locate the position of the alignment mark 106 in some embodiments.

At step 208, back-end processes are performed on the wafer assembly 100. The back-end processes can include wafer testing, wafer back-grinding, die separation, and/or die tests, among others. The back-end processes can be performed by any suitable processes known in the art.

At step 212, the wafer assembly 100 goes through further back-end process such as packaging in some embodiments. In some other embodiments, the carrier wafer 104 is debonded (or detached) from the process wafer 102 at step 210 prior to step 212. The carrier wafer 104 can be reused. For debonding (or detaching) the carrier wafer 104 from the process wafer 102, the wafer assembly 100 is fixed in an appropriate debond-module on both sides with a compliant chucking system (e.g., vacuum chucks), then uniformly heated (e.g., 300° C.-400° C.) to a debonding temperature. When the debonding temperature is reached, the process wafer 102 and the carrier wafer 104 are slid apart. The process wafer 102 is fully supported on the whole area and kept stress-free during the debonding process.

For wafer assembly 100 using bonding materials (adhesive), the debond temperature can be 200° C. or lower, depending on the bonding materials in some embodiments. After separation of the wafers, the process wafer 102 is cleaned in a single wafer-cleaning chamber, where the remaining bonding material (adhesive) is removed with an appropriate solvent in some embodiments.

According to some embodiments, a method includes bonding a process wafer having integrated circuits and a carrier wafer having at least one alignment mark to form a wafer assembly. The wafer assembly is aligned using the at least one alignment mark of the carrier wafer.

According to some embodiments, a method includes bonding a process wafer having integrated circuits and a carrier wafer having at least one alignment mark to form a wafer assembly. The method further includes aligning the wafer assembly using the at least one alignment mark of the carrier wafer.

According to some aspects of the present disclosure, a method of forming a semiconductor device includes forming an integrated circuit on a process wafer. The method further includes aligning the carrier wafer and the process wafer using an alignment mark on the carrier wafer. Additionally, the method includes bonding the process wafer to a carrier wafer, wherein the carrier wafer has a thickness greater than 2000 μm.

Still according to some aspect of the present disclosure, a method of forming a semiconductor device includes forming a wafer assembly, where forming the wafer assembly includes bonding a process wafer to a carrier wafer. The carrier wafer has a thickness greater than 2000 μm. The method further includes aligning the carrier wafer and the process wafer using an alignment mark on the carrier wafer. Additionally, the method includes performing a back-end process on the wafer assembly. Moreover, the method includes packaging the wafer assembly.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
   bonding a process wafer having integrated circuits and a carrier wafer having at least one alignment mark to form a wafer assembly;
   aligning the wafer assembly using the at least one alignment mark of the carrier wafer, wherein no alignment mark is formed in the process wafer;
   processing the process wafer after the step of aligning; and
   debonding the carrier wafer from the process wafer after the step of processing the process wafer.

2. The method of claim 1, wherein the bonding is performed by using a bonding adhesive layer between the process wafer and the carrier wafer.

3. The method of claim 1, wherein the bonding comprises:
   growing an epi layer under the process wafer or over the carrier wafer;
   placing the process wafer and the carrier wafer together with the epi layer located between the process wafer and the carrier wafer; and
   annealing the process wafer, the epi layer, and the carrier wafer.

4. The method of claim 3, wherein the epi layer has a thickness ranging from 100 angstroms to 1000 angstroms.

5. The method of claim 3, wherein the annealing is performed at a temperature ranging from 300° C. to 500° C.

6. The method of claim 1, wherein bonding the process wafer to the carrier wafer comprises bonding the process wafer to the carrier wafer having multiple alignment marks distributed at equal distance along the circumference of the carrier wafer.

7. The method of claim 6, wherein bonding the process wafer to the carrier wafer comprises bonding the process wafer to the carrier wafer having at least one alignment mark of the multiple alignment marks having a different size from at least one other alignment mark of the multiple alignment marks.

8. The method of claim 1, wherein bonding the process wafer to the carrier wafer comprises bonding the process wafer having a first thickness to the carrier wafer having a second thickness, wherein the first thickness is less than the second thickness.

9. The method of claim 1, wherein aligning the wafer assembly using the at least one alignment mark of the carrier wafer comprises rotating the wafer assembly up to 120 degrees.

10. The method of claim 1, wherein the at least one alignment mark is an opening, and the method further comprising forming the opening in a sidewall of the carrier wafer.

11. A method of forming a semiconductor device, the method comprising:
    forming an integrated circuit on a process wafer, the process wafer having a first diameter;
    forming alignment marks in a sidewall of a carrier wafer, the carrier wafer having a second diameter;
    bonding the process wafer to the carrier wafer to form a wafer assembly, wherein the carrier wafer has a thickness greater than 2000 µm;
    aligning the wafer assembly using an alignment mark detector to detect the alignment marks;
    processing the process wafer after the aligning the wafer assembly; and
    debonding the carrier wafer from the process wafer after the processing.

12. The method of claim 11, wherein bonding the process wafer to the carrier wafer comprises using a bonding adhesive.

13. The method of claim 11, wherein bonding the process wafer to the carrier wafer comprises:
    growing an epitaxial layer between the process wafer and the carrier wafer; and
    annealing the epitaxial layer, the process wafer and the carrier wafer.

14. The method of claim 13, wherein annealing the epitaxial layer, the process wafer and the carrier wafer comprises annealing the epitaxial layer, the process wafer and the carrier wafer at temperatures ranging from 300° C.-500° C.

15. The method of claim 11, wherein the first diameter and the second diameter are the same.

16. The method of claim 11, wherein forming the alignment marks in the sidewall of the carrier wafer comprises forming three notches evenly spaced around the circumference of the carrier wafer, wherein each of the three notches has a different size from each other of the three notches.

17. A method of forming a semiconductor device, the method comprising:
    forming a wafer assembly, wherein forming the wafer assembly comprises bonding a process wafer to a carrier wafer, wherein the carrier wafer has a thickness greater than 2000 µm;
    aligning the carrier wafer and the process wafer using a notch formed on the peripheral edge of the carrier wafer, wherein no alignment mark is formed in the process wafer;
    performing a back-end process on the wafer assembly; and
    packaging the wafer assembly.

18. The method of claim 17, further comprising debonding the process wafer from the carrier wafer.

19. The method of claim 18, wherein the debonding comprises heating the wafer assembly to a temperature ranging from 300° C.-400° C.

20. The method of claim 18, wherein the debonding comprises heating the wafer assembly to a temperature of 200° C. or lower.

21. The method of claim 17, wherein performing the back-end process comprises wafer testing, wafer backgrinding, die separation or die tests.

* * * * *